United States Patent [19]

Davis et al.

[11] Patent Number: 4,488,193

[45] Date of Patent: Dec. 11, 1984

[54] CLOSED LOOP COOLING SYSTEM FOR DISK FILE WITH HEAT EXCHANGER INTEGRAL WITH BASEPLATE

[75] Inventors: Richard A. Davis, San Jose; Stanton K. Moss, Gilroy; Sang-Yen Wang, San Jose, all of Calif.

[73] Assignee: International Business Machines Corporation, Armonk, N.Y.

[21] Appl. No.: 480,628

[22] Filed: Mar. 30, 1983

[51] Int. Cl.[3] ........................ G11B 23/04; G11B 25/04

[52] U.S. Cl. ........................................ 360/98; 360/133

[58] Field of Search ....................... 360/97, 98, 99, 133

[56] References Cited

U.S. PATENT DOCUMENTS 3,846,835 11/1974 Horowirz et al. .................... 360/98

4,194,225 3/1980 Hasler .................................. 360/98

*Primary Examiner*—Vincent P. Canney

*Attorney, Agent, or Firm*—Richard E. Cummins

[57] ABSTRACT

An improved cooling and filtration system for a disk file is provided in which a closed loop path is established in the disk enclosure extending from the area of the disk hub through holes in disk spacers radially outward across the disk surface, down the vertical walls of the enclosure and back to the impellar of the disk hub through one of two parallel branch segments of the closed loop. One of the parallel branch segments is through a high impedance, low volume filter branch which contains a filter to remove debris. The other branch segment is a low impedance, high volume branch which includes the hot side of a heat exchanger which is an integral part of the disk file baseplate on which the disk shaft and positioning system components are mounted. A separate open loop path outside of the disk enclosure extends from the impellar surface of the driving pulley attached to the disk spindle through the cold side of the heat exchanger.

9 Claims, 3 Drawing Figures

10
11
12
2
2

10
14A
14
16
40
51
12
51B
55
51B
51B
51A
70
34
15
81
82
18B
59
17
18
13
70
11

CLOSED LOOP COOLING SYSTEM FOR DISK FILE WITH HEAT EXCHANGER INTEGRAL WITH BASEPLATE

BACKGROUND OF INVENTION

1. Field of Invention

This invention relates in general to magnetic disk storage devices and, in particular, to an improved cooling and filtration system for the head disk assembly (HDA) of magnetic disk storage devices.

2. Description of the Prior Art

The prior art discloses various magnetic disk storage devices and various arrangements for cooling such devices. Cooling arrangements for disk files are needed to both limit the temperature to safe operating limits and to stabilize the temperature to which the disks, magnetic transducers, and various mechanical components are subjected. It is well known that considerable heat is produced by the rotating disks, and the amount of heat that is generated is related to the size of the disk and the rotational speed of the disk stack.

The ability to increase storage capacity on the disk surface is directly related to stabilizing the temperature in the environment of the head disks since a change in temperature does affect the positional relationship of the various components of the recording system. It is also known that considerable improvement in capacity can be obtained by decreasing the spacing between the magnetic transducer and the disk surface.

As the head to disk spacing is decreased, it becomes readily apparent that the prior art cooling arrangements, which were normally of the open loop type cooling systems, require some type of filter in order to insure that particles in the air being used to stabilize the temperature are smaller than the head to disk spacing.

While the provision of the filter in an open loop system avoids the problems of head crashes due to particles in the cooling air, it increases the impedance of the open loop air path and imposes a requirement to periodically check and replace the filter. It soon became readily apparent that with an open loop system cooling arrangement having a filter, any required increase in the volume of cooling air which might have been prompted by the desire to add additional disks, increase the disk size, or operating speed, materially shortens the life of the filter. Similarly, any decrease in the head to disk spacing required a finer filter and an increase in impedance in the air path, and also a shorter filter life.

To overcome these restrictions, various arrangements of closed loop cooling systems were proposed in the art.

The term closed loop system, as used in this art, is not the same as hermetically sealed systems. In the disk file art, a closed loop system implies some provision to allow for makeup air since the enclosure is not hermetically sealed. Generally in such systems, the percent of makeup air required relative to the volume of air in the closed system is well below 5%, and generally below 1%. These closed loop cooling systems do avoid the filter life problem which resulted from pumping a huge volume of air through a filter. However, their applications have been limited to relatively small disk files or HDA's where the amount of heat generated within the enclosure is small and manageable and which can be dissipated through the walls of the HDA enclosure. Where closed loop cooling systems are used in large files, separate, expensive, heat exchangers for removing heat from the circulated air are required since the heat generated cannot be otherwise dissipated.

In early prior art disk file systems, the air bearing magnetic transducer never comes in contact with the surface of the disk. In these early files, the transducer positioning systems were designed to either retract the transducers by moving them radially out of the cylinder of the disks or by vertically unloading the head when the disks were not being rotated. In these arrangements, the possibility of generating debris internally of the enclosure from the disk surface was, therefore, relatively small. However, in an effort to improve the operation of the positioning system by reducing its mass, the start-stop in contact system was developed in which the heads are moved to an area of the disk referred to as the "landing zone" where no data was recorded prior to powering down the file. The start-stop in contact arrangement is one aspect of the "Winchester" type technology that is used extensively in disk files today. The fact that the transducer now contacts the moving disk surface during startup and power down operations increased the possibility of internal debris being generated which will be circulated by the closed loop system and may eventually cause a head crash.

Recently, the art has developed closed loop systems which employ start-stop in contact arrangements where a filter is provided in the closed loop path to filter part of the air. However, such systems are limited to file arrangements which have small disks or only one or two large disks because the heat dissipation capability of the closed loop system is diminished by inclusion of the filter for the same reasons that occurred in the prior art open loop type systems.

The present invention is directed to an improved closed loop cooling and filtering arrangement for a start-stop in contact type disk file which is capable of dissipating considerably more heat, thereby permitting an increase in storage capacity since an increase in the storage surface, i.e., more or larger disks, may be provided.

SUMMARY OF THE INVENTION

An improved cooling and filtration system for a disk file is provided in which a closed loop path is established in the disk enclosure extending, for example, from the area of the disk hub through holes in disk spacers radially outward across the disk surface, which accelerates the air down the vertical walls of the enclosure and returns back to the impellar of the disk hub through one of two parallel branch segments of the closed loop. One of the parallel branch segments is through the high impedance, low volume filter branch which contains a filter which functions to remove debris that has been internally generated in the HDA. The other branch segment is a low impedance, high volume branch which includes the hot side of a heat exchanger which is an integral part of the disk file baseplate on which the disk shaft and positioning system components are mounted.

The arrangement further includes a separate open loop path outside of the disk enclosure which extends from the impellar surface of the driving pulley attached to the disk spindle through the cold side of the heat exchanger. The heat exchanger comprises radially extending rib members which extend downwardly from the bottom of the baseplate and are formed integrally therewith.

It is, therefore, an object of the present invention to provide an improved cooling and filtration arrangement for a disk file.

A further object of the present invention is to provide a cooling and filtering system for a disk file which involves transferring of heat through a heat exchanger integral to the baseplate of the disk file.

The foregoing and other objects, features and advantages of the invention will be apparent from the following more particular description of a preferred embodiment of the invention as illustrated in the accompanying drawing.

DESCRIPTION OF THE PREFERRED EMBODIMENT

Figures 1, 2:
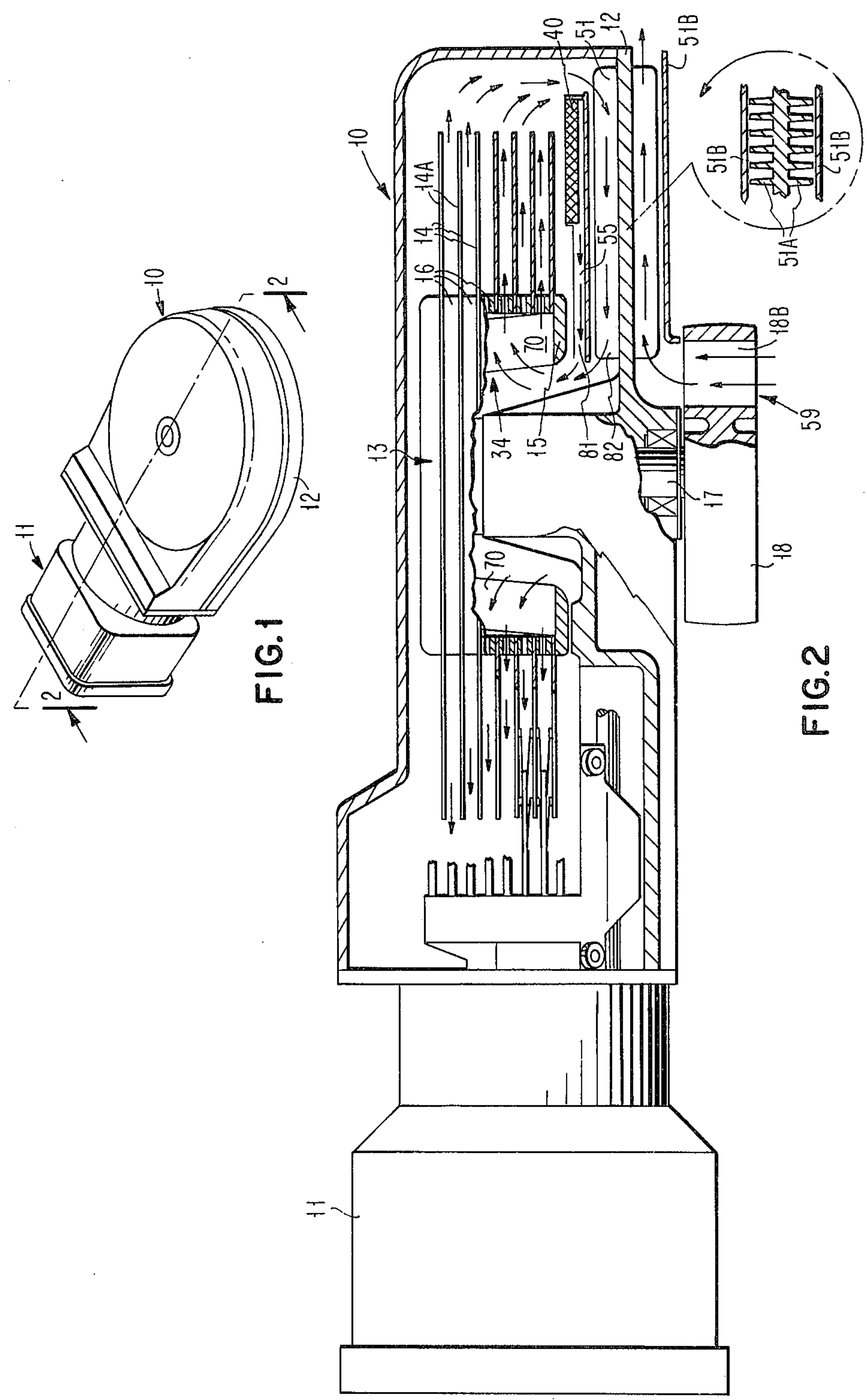
FIG. 1 is a perspective view of a head disk assembly embodying the present invention.
FIG. 2 is a sectional view of the HDA shown in FIG. 1 taken along the line 2—2.

FIG. 1 is a perspective view of a head disk assembly which is referred to hereafter as an HDA. The HDA shown in FIG. 1 corresponds generally to the HDA shown and described in U.S. Pat. No. 4,034,411 which is based on the IBM 3350 disk storage device. The term HDA is used in this industry to describe a field replaceable unit that includes a baseplate for mounting the disk spindle and actuator mechanism of the positioning system. Generally, when the positioning system actuator motor is a voice coil motor, the heavy magnet assembly of the voice coil motor will be attached to the frame of the disk drive and not be an integral part of the HDA. Also, in some HDA arrangements, a pulley member is attached to the end of the spindle which extends externally of the HDA to permit a suitable drive belt to be wrapped on the pulley to provide for rotation of the disks. In another arrangement, the drive motor itself is mounted to the bottom of the baseplate with the disk spindle and motor shaft being directly coupled to each other so as to rotate the disks.

Some disk drives employ rotating type actuators. The actuator is mounted to the baseplate and designed to pivot about an axis parallel to the disk spindle in the process of positioning the transducers relative to tracks on the disk. This type of HDA is also sometimes referred to as a disk enclosure (DE).

In either arrangement, a suitable enclosure surrounds the disk stack and the head positioning system components and is attached to the baseplate to form a substantially airtight enclosure. Depending on the type of positioning system, the enclosure may include the actuator motor or a suitable seal will be provided to permit movement of the transducers relative to the disks and the motor assembly while still providing a suitable sealed enclosure. The HDA of FIG. 1 is of this type.

As shown in FIG. 2, the HDA 10 is attached to the voice coil motor structure 11 by some suitable means not shown.

The HDA includes a baseplate 12, a stack 13 of disks 14 which are mounted in a disk hub 15 and spaced apart in the axial direction by disk spacer ring 16. A suitable disk clamp (not shown) clamps the disks 14 and the spacer ring 16 to hub 15 and also attaches the disk hub 15 to the disk spindle 17 in a conventional manner. The disk spindle 17 is mounted in the baseplate for rotation by a suitable set of bearings (not shown) with one end of the spindle extending beyond the baseplate 12 in order to attach the pulley 18.

The amount of heat that is generated in the HDA enclosure may be determined by known formulas, the specific form of which is only significant from the standpoint that they indicate that, as the number of disks are increased or the dimensions of the disks are increased, the temperature increases in a linear fashion. However, as the speed of the disk pack is increased, the increase in temperature is exponential. The need to increase rotational speed may be prompted by a desire to maintain the same data rate using smaller disks. If the recording density along the length of the track is the same for both size disks, the shorter track of the smaller disk must be rotated faster to achieve the same data rate.

The improved cooling and filtration arrangement that is embodied in the HDA of FIG. 2 will first be described in connection with the schematic diagram of the system shown in FIG. 3.

Figure 3:
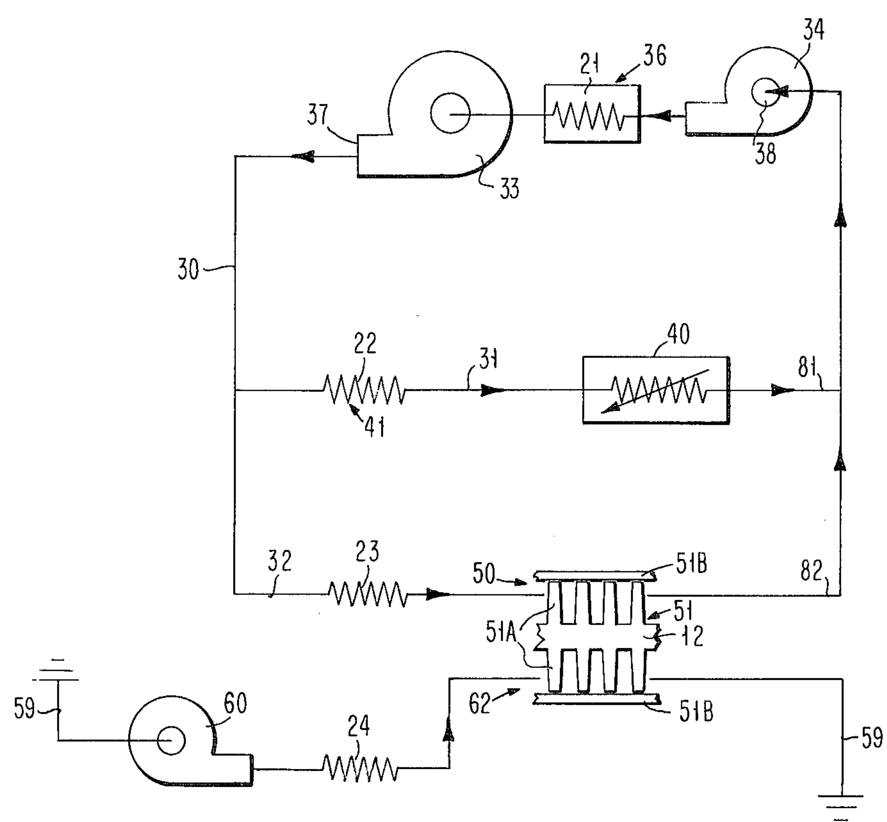
FIG. 3 is a schematic diagram of the improved cooling and filtration system embodied in the HDA shown in FIG. 2.

As depicted in FIG. 3, the improved arrangement comprises a closed loop path 30 which includes a pair of parallel branch paths 31 and 32. A pair of pumps 33 and 34 are shown in the main portion of the closed loop path. Pump 33 represents the pumping action of the magnetic disks while pump 34 represents an impellar pump formed integrally on the disk hub on the inside of the disk spacers. Impedance 36 shown in FIG. 3 represents the restriction to air flow caused by the openings in the disk spacers 16 as the air is moved between the two pumps 33 and 34. As shown in FIG. 3, air leaves the outlet 37 of pump 33 and is returned to the input 38 through one of two parallel branches 31 and 32. Branch 31 contains an air filter 40 which represents a relative high impedance 41 to the flow of air between outlet 37 of pump 33 and inlet 38 of pump 34. As a result, only a relatively small volume of total air being circulated passes through branch 31 and is filtered.

Branch 32 includes the hot side 50 of a heat exchanger 51 which is formed integral with the baseplate 12. Heat exchanger 51 comprises a plurality of finned members 51A which extend vertically upward, as shown in FIG. 3, from the baseplate and are covered by a plate 51B parallel to the baseplate to define closed channel. The rib members 51A extend in a generally radial direction which permits a relatively low impedance to exist in each of the channels between the output 37 of pump 33 and inlet 38 of pump 34. As a result, most of the air being circulated in the closed loop path 30 passes through the hot side 50 of the heat exchanger 51 as it returns to the inlet 38. Since the rib members 51A extend generally in a radial direction from the central axis to the outer circumferential edge of the baseplate 12, the number of ribs 51A can be increased, or the effective area of the heat exchanger can be increased, from a small pie-shaped sector to a complete 360° arrangement.

The cooling arrangement of FIG. 3 further includes the open loop air path 59 which involves the pump 60 implemented by the pulley impellar 18A (FIG. 2) and the cold side 62 of the heat exchanger 51. The open loop path 59 is a high volume, low impedance path to permit the ready removal of heat by the heat exchanger 51. Referring to FIG. 2, the heat exchanger 51, which is an integral part of the baseplate 12, is shown in detail in the exploded view which illustrates the radially extending ribs 51A and plates 51B. The secondary pump 34 implemented by the hub 15 is provided with blades 70 to form an impellar that drags air from the outlet port 81 of the filter 40 and parallel port 82 of the heat exchanger 51 up inside the disk stack and forces the air out through the openings in the spacer rings 16 to the surfaces of disks 14.

The filter 40 is shown in FIG. 2 disposed above the heat exchanger 51 and is provided with an extension tube 55 which terminates in the low pressure area of the hub impellar. The extension tube 55 insures that some air leaving the disk surface 14A is motivated to pass through the filter 40 by establishing an appropriate pressure differential on opposite sides of the filter 40.

The external air path 59 shown in FIG. 2 involves the drive pulley 18 which is provided with impellar blades 18B, as shown.

While the invention has been particularly shown and described with reference to a preferred embodiment thereof, it will be understood by those skilled in the art that various changes in the form and details may be made therein without departing from the spirit and scope of the invention.

Having thus described our invention, what we claim as new and desire to secure by Letters Patent is:

1. In a disk file having an HDA comprising a baseplate, a plurality of magnetic disks which store information mounted on a spindle bearinged in said baseplate, a plurality of air bearing magnetic transducers, and means for positioning said transducers relative to said disks, an improved system for maintaining the operating temperature within the HDA enclosure substantially constant at a predetermined safe temperature and substantially free of contaminating particles which could adversely affect the normal air bearing relationship between any one of said transducers and an associated disk surface, said system comprising:

(1) means for circulating air internally of said HDA in a substantially closed loop path which extends from the rotational axis of said stack of magnetic disks radially outward across the disk surfaces to the walls of said HDA and includes a return segment from said walls to the axis of said stack, said closed loop path involving first and second parallel branches, said first branch including a filter which creates a relatively high impedance, low volume path for said air in said first branch, said second branch including one side of a heat exchanger which creates a relatively low impedance, high volume path for said air in said second branch; and (2) means for circulating air externally of said HDA in an open loop path which extends through the cold side of said heat exchanger, said heat exchanger being integral with said baseplate whereby the temperature within said HDA is maintained substantially constant at a safe operating temperature by the relatively high volume of air being circulated in said closed loop path to permit a rapid removal of heat by said heat exchanger and any particles that are generated internally of said enclosure which might adversely affect said normal air bearing relationship are removed from said closed loop path by said filter.

2. The combination recited in claim 1 in which said means for circulating air internally of said HDA includes an impellar disposed on said spindle.

3. The combination recited in claim 2 in which a disk hub is mounted on said spindle and said disks are mounted on said hub in spaced relationship by disk spacer rings.

4. The combination recited in claim 3 in which said spacer rings surround said spindle and are provided with a plurality of circumferentially spaced openings in each said ring to permit air being pumped by said impellar to be directed through said openings to said disk surfaces.

5. The combination recited in claim 4 in which said one side of said heat exchanger includes a first plurality of rib members which are integral to said baseplate and extend lengthwise in a radial direction and are normal to the inner surface of said baseplate, said one side further including a first cover plate attached to said rib members to form a plurality of low impedance air passages for said closed loop path.

6. The combination recited in claim 5 in which said means for circulating air externally includes an impellar mounted externally of said HDA enclosure for rotation with said spindle and means for directing air from said externally mounted impellar to the input of said cold side of said heat exchanger.

7. The combination recited in claim 6 in which said cold side of said heat exchanger includes a second plurality of rib members which extend lengthwise in a direction parallel to said first plurality of rib members and which are normal to the outer surface of said baseplate, said cold side further including a second cover plate attached to said rib members of said second plurality to form another plurality of low impedance air passages in said open loop path.

8. The combination recited in claim 7 in which said first and second plurality of rib members are disposed opposite to each other in an efficient heat transfer relationship.

9. The combination recited in claim 8 in which the direction of air in said closed loop path through said heat exchanger is in one direction and the direction of air in said open loop path through said heat exchanger is in an opposite direction.

* * * * *